United States Patent
Huang et al.

(10) Patent No.: US 11,055,023 B2
(45) Date of Patent: Jul. 6, 2021

(54) ELECTRONIC DEVICE, RELATED CONTROLLER CIRCUIT AND METHOD

(71) Applicant: RAYMX Microelectronics Corp., Hefei (CN)

(72) Inventors: Shih-Fu Huang, Taoyuan (TW); Yi-Lin Hsieh, Changhua County (TW); Cheng-Yu Chen, New Taipei (TW)

(73) Assignee: RAYMX MICROELECTRONICS CORP., Hefei (CN)

( * ) Notice: Subject to any disclaimer, the term of this patent is extended or adjusted under 35 U.S.C. 154(b) by 0 days.

(21) Appl. No.: 16/392,164

(22) Filed: Apr. 23, 2019

(65) Prior Publication Data
US 2020/0293224 A1 Sep. 17, 2020

(30) Foreign Application Priority Data
Mar. 15, 2019 (CN) .......................... 201910196083.9

(51) Int. Cl.
*G06F 12/00* (2006.01)
*G06F 3/06* (2006.01)
*G11C 16/10* (2006.01)

(52) U.S. Cl.
CPC .......... *G06F 3/0659* (2013.01); *G06F 3/0604* (2013.01); *G06F 3/064* (2013.01); *G06F 3/0679* (2013.01); *G11C 16/10* (2013.01)

(58) Field of Classification Search
CPC ...... G06F 3/0659; G06F 3/0604; G06F 3/064; G06F 3/0679; G11C 16/10
See application file for complete search history.

(56) References Cited

U.S. PATENT DOCUMENTS

| | | | |
|---|---|---|---|
| 9,400,713 B2 | 7/2016 | Gorobets | |
| 9,778,863 B2 | 10/2017 | Agarwal et al. | |
| 9,898,364 B2 | 2/2018 | Higgins et al. | |
| 10,140,027 B1* | 11/2018 | Canepa | G06F 3/0659 |
| 2008/0062768 A1 | 3/2008 | Li et al. | |
| 2008/0172520 A1* | 7/2008 | Lee | G11C 11/5628 711/103 |
| 2008/0172521 A1* | 7/2008 | Lee | G06F 12/0246 711/103 |
| 2009/0310413 A1 | 12/2009 | Lasser | |
| 2011/0296087 A1* | 12/2011 | Kim | G06F 12/0246 711/103 |

(Continued)

FOREIGN PATENT DOCUMENTS

CN 107527655 A 12/2017

*Primary Examiner* — Prasith Thammavong
(74) *Attorney, Agent, or Firm* — McClure, Qualey & Rodack, LLP

(57) ABSTRACT

An electronic device includes: a storage device containing a target block having multiple word lines and multiple bit lines; a transmission interface configured to operably receive data to be written into the storage device; and a controller circuit including: an access circuit; and a flash memory control circuit configured to operably control the access circuit to write a first data into one or more pages connected with a first word line in the target block using a first program scheme, and to operably control the access circuit to write a second data into one or more pages connected with a second word line in the target block using a second program scheme, so that the first data and the second data are stored in the target block at the same time.

20 Claims, 7 Drawing Sheets

| Flash Memory Block | Word Line | Word-Line Type |
|---|---|---|
| ⋮ | ⋮ | ⋮ |
| 112 | 121 | S-type |
| ⋮ | ⋮ | ⋮ |
| 112 | 122 | M-type |
| ⋮ | ⋮ | ⋮ |
| 112 | 123 | S-type |
| ⋮ | ⋮ | ⋮ |
| 114 | 124 | T-type |
| ⋮ | ⋮ | ⋮ |
| 114 | 125 | T-type |
| ⋮ | ⋮ | ⋮ |
| 114 | 126 | M-type |
| ⋮ | ⋮ | ⋮ |
| 116 | 127 | Q-type |
| ⋮ | ⋮ | ⋮ |
| 116 | 128 | Q-type |
| ⋮ | ⋮ | ⋮ |
| 116 | 129 | Q-type |
| ⋮ | ⋮ | ⋮ |

(56) References Cited

U.S. PATENT DOCUMENTS

| | | | |
|---|---|---|---|
| 2012/0079167 A1* | 3/2012 | Yao | G06F 12/0246 |
| | | | 711/103 |
| 2013/0232296 A1* | 9/2013 | Yonezawa | G06F 12/0246 |
| | | | 711/103 |
| 2014/0359346 A1* | 12/2014 | Chen | G06F 11/1402 |
| | | | 714/6.11 |
| 2015/0160893 A1* | 6/2015 | Gorobets | G06F 12/0646 |
| | | | 711/103 |
| 2016/0049192 A1* | 2/2016 | Lee | G11C 11/5642 |
| | | | 365/185.03 |
| 2016/0170671 A1* | 6/2016 | Huang | G06F 3/0659 |
| | | | 711/103 |
| 2017/0116095 A1* | 4/2017 | Schatz | G06F 11/1425 |
| 2017/0160976 A1* | 6/2017 | Thangaraj | G06F 3/0604 |
| 2017/0221584 A1 | 8/2017 | Chen et al. | |
| 2018/0129440 A1 | 5/2018 | Bandic et al. | |
| 2018/0321855 A1* | 11/2018 | Martineau | G06F 3/0604 |
| 2019/0129629 A1* | 5/2019 | Lin | G06F 3/0679 |

\* cited by examiner

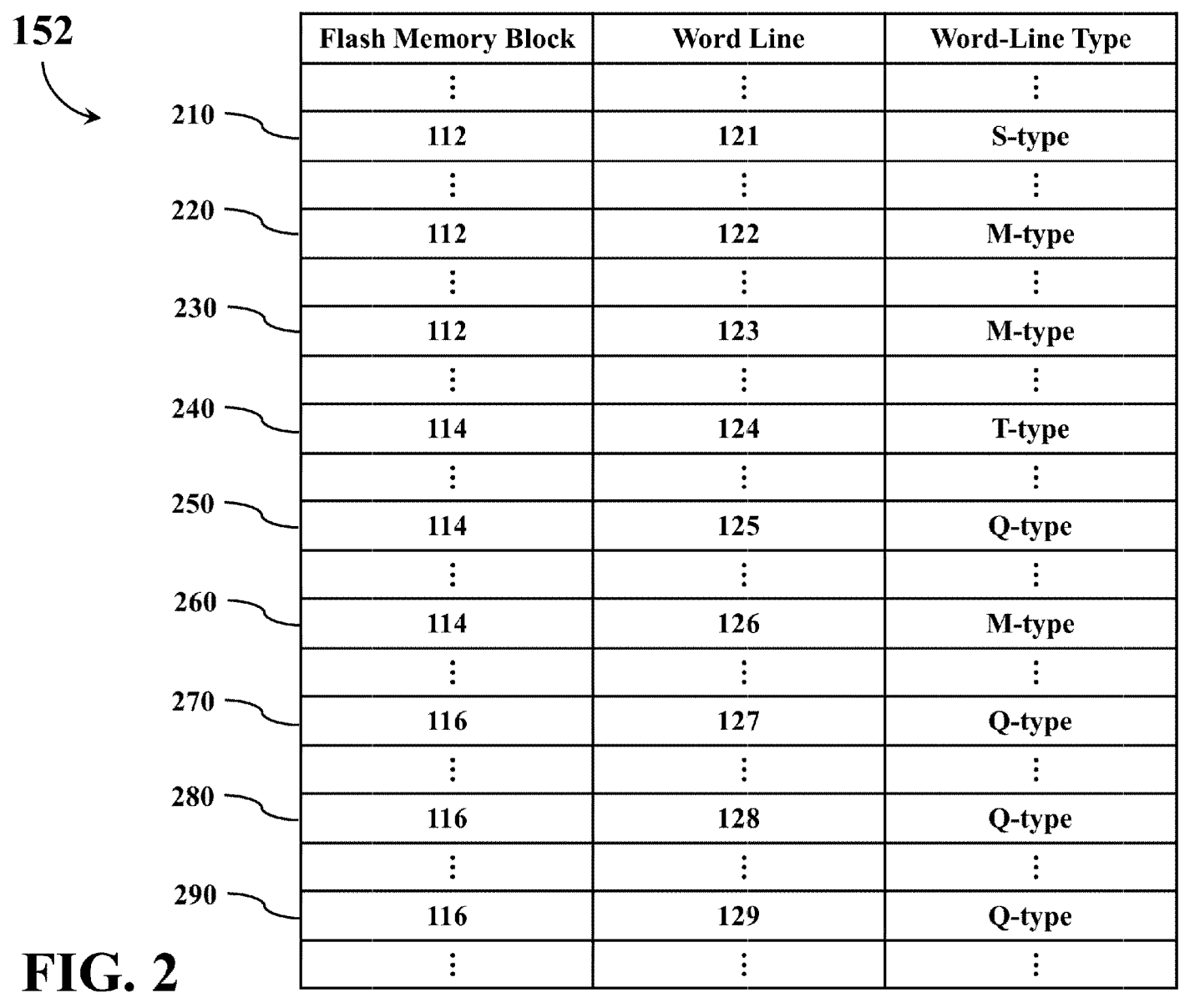

| Flash Memory Block | Word Line | Word-Line Type |
|---|---|---|
| ... | ... | ... |
| 112 | 121 | S-type |
| ... | ... | ... |
| 112 | 122 | M-type |
| ... | ... | ... |
| 112 | 123 | M-type |
| ... | ... | ... |
| 114 | 124 | T-type |
| ... | ... | ... |
| 114 | 125 | Q-type |
| ... | ... | ... |
| 114 | 126 | M-type |
| ... | ... | ... |
| 116 | 127 | Q-type |
| ... | ... | ... |
| 116 | 128 | Q-type |
| ... | ... | ... |
| 116 | 129 | Q-type |
| ... | ... | ... |

FIG. 2

| Flash Memory Block | Word Line | Word-Line Type |
|---|---|---|
| ... | ... | ... |
| 112 | 121 | S-type |
| ... | ... | ... |
| 112 | 122 | M-type |
| ... | ... | ... |
| 112 | 123 | S-type |
| ... | ... | ... |
| 114 | 124 | T-type |
| ... | ... | ... |
| 114 | 125 | T-type |
| ... | ... | ... |
| 114 | 126 | M-type |
| ... | ... | ... |
| 116 | 127 | Q-type |
| ... | ... | ... |
| 116 | 128 | Q-type |
| ... | ... | ... |
| 116 | 129 | Q-type |
| ... | ... | ... |

ELECTRONIC DEVICE, RELATED CONTROLLER CIRCUIT AND METHOD

CROSS-REFERENCE TO RELATED APPLICATIONS

This application claims the benefit of priority to Patent Application No. 201910196083.9, filed in China on Mar. 15, 2019; the entirety of which is incorporated herein by reference for all purposes.

BACKGROUND

The disclosure generally relates to an electronic device and, more particularly, to an electronic device, related controller circuit and method for flexibly adjusting data program schemes.

Some electronic devices (e.g., SSD devices or flash memory cards) comprise many flash memory blocks, and these flash memory blocks are typically divided into over provision blocks (OP blocks) or data blocks. The quantity of the OP blocks affects the operating performance of the electronic device, and the quantity of the data blocks affects the storage capacity of the electronic device. When unusable pages in a block exceeds a predetermined level, the control circuit of a conventional electronic device would mark the entire block as a "bad block" and no longer utilizes any page in the block for storing data.

On the other hand, the control circuit of the conventional electronic device configures a data program scheme for each block on a block basis. Accordingly, if a selected data program scheme is not suitable for a block since the block has defects in some pages, writing data into the block using the selected data program scheme may easily result in data error problems or increase the possibility that the block be determined as a "bad block" by the conventional control circuit, thereby reducing the available storage space of the electronic device.

Apparently, the control mechanism of the conventional electronic device is unable to fully utilize the storage capacity of the flash memory blocks and lacks flexibility in the use of the flash memory blocks, and thus it is difficult to effectively improve the operating performance of the electronic device.

SUMMARY

An example embodiment of an electronic device is disclosed. The electronic device comprises: a storage device, comprising a plurality of flash memory blocks, wherein the flash memory blocks comprises a target block, and the target block comprises a plurality of word lines and a plurality of bit lines; a transmission interface arranged to operably receive data to be written into the storage device; and a controller circuit, comprising: an access circuit coupled with the storage device; and a flash memory control circuit coupled with the access circuit and the transmission interface, and arranged to operably conduct following operations: controlling the access circuit to write a first data into one or more pages coupled with a first word line in the target block using a first program scheme at a first time point; and controlling the access circuit to write a second data into one or more pages coupled with a second word line in the target block using a second program scheme at a second time point, so as to render both the first data and the second data to be present in the target block at the same time.

An example embodiment of a controller circuit for controlling a storage device is disclosed. The storage device comprises a plurality of flash memory blocks, the flash memory blocks comprise a target block, the target block comprises a plurality of word lines and a plurality of bit lines. The controller circuit comprises: an access circuit for coupling with the storage device; and a flash memory control circuit coupled with the access circuit and for coupling with a transmission interface, wherein the transmission interface is arranged to operably receive data to be written into the storage device, and the flash memory control circuit is arranged to operably conduct following operations: controlling the access circuit to write a first data into one or more pages coupled with a first word line in the target block using a first program scheme at a first time point; and controlling the access circuit to write a second data into one or more pages coupled with a second word line in the target block using a second program scheme at a second time point, so as to render both the first data and the second data to be present in the target block at the same time.

An example embodiment of a method for controlling a storage device is disclosed. The storage device comprises a plurality of flash memory blocks, the flash memory blocks comprise a target block, the target block comprises a plurality of word lines and a plurality of bit lines. The method comprises: writing a first data into one or more pages coupled with a first word line in the target block using a first program scheme at a first time point; and writing a second data into one or more pages coupled with a second word line in the target block using a second program scheme at a second time point, so as to render both the first data and the second data to be present in the target block at the same time.

Both the foregoing general description and the following detailed description are examples and explanatory only, and are not restrictive of the invention as claimed.

BRIEF DESCRIPTION OF THE DRAWINGS

FIG. 2 shows a simplified schematic diagram of a word-line category record according to one embodiment of the present disclosure.

FIG. 6 shows a simplified schematic diagram of a word-line category record according to another embodiment of the present disclosure.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
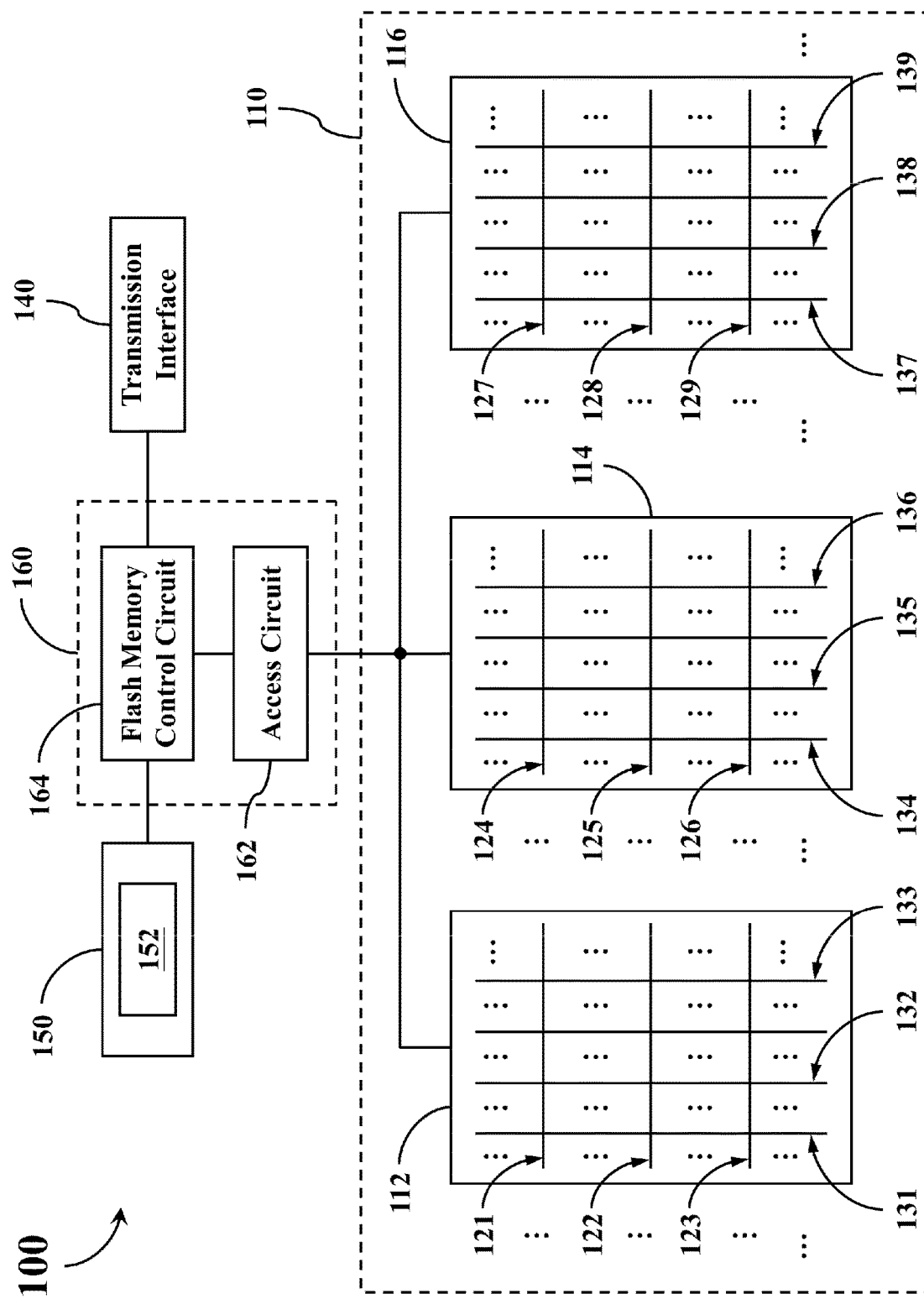
FIG. 1 shows a simplified functional block diagram of an electronic device according to a first embodiment of the present disclosure.

FIG. 1 shows a simplified functional block diagram of an electronic device 100 according to a first embodiment of the present disclosure. The electronic device 100 comprises a storage device 110, a transmission interface 140, a non-volatile storage circuit 150, and a controller circuit 160.

The storage device 110 comprises multiple flash memory blocks, such as the exemplary blocks 112, 114, and 116 shown in FIG. 1. As illustrated in FIG. 1, each flash memory block comprises multiple word lines and multiple bit lines. For example, the block 112 comprises exemplary word lines 121, 122, and 123 and exemplary bit lines 131, 132, and 133; the block 114 comprises exemplary word lines 124, 125, and 126 and exemplary bit lines 134, 135, and 136; the block 116 comprises exemplary word lines 127, 128, and 129 and exemplary bit lines 137, 138, and 139.

In each flash memory block, the intersection of every word line and every bit line is arranged with a storage cell for storing data. Therefore, each flash memory block comprises many storage cells. In order to simplify the complexity of the drawing, these storage cells are not illustrated in FIG. 1.

Each of the blocks 112, 114, and 116 in the storage device 110 may be realized with SLC (Single-level cell) chips, MLC (Multi-level cell) chips, TLC (Triple-level cell) chips, QLC (Quad-level cell) chips, or chips of higher class.

The transmission interface 140 is arranged to operably conduct data transmission with a host device (not shown in FIG. 1). In practice, the transmission interface 140 may be realized with the interface circuit compatible to various SATA (Serial Advanced Technology Attachment) series transmission standards, PCIe (peripheral component interconnect express) series transmission standards, and/or USB (Universal Serial Bus) series transmission standards.

The storage circuit 150 is utilized for storing a categorization result of word lines of respective blocks in the storage device 110.

The controller circuit 160 comprises an access circuit 162 and a flash memory control circuit 164. The access circuit 162 is coupled with the storage device 110. The flash memory control circuit 164 is coupled with the transmission interface 140 and the storage circuit 150, and is arranged to operably access the storage device 110 through the access circuit 162. When data is required to be written into the storage device 110, the flash memory control circuit 164 selects an appropriate block from the storage device 110 and chooses a data program scheme for the storage cells coupled with each word line of the selected block according to the word-line categorization result stored in the storage circuit 150.

In practice, the storage circuit 150 may be independently arranged outside the controller circuit 160, or may be integrated into the controller circuit 160. For simplicity of illustration, other components in the electronic device 100 and their connection relationship and implementations are not shown in FIG. 1.

During the manufacturing or assembling process of the storage device 110, the manufacturer may conduct tests on various circuit characteristics for all flash memory blocks in the storage device 110 to assess the extent and/or distribution of the defects existing in the main array of each block. The manufacturer of the storage device 110 may assess the hardware quality, data reading reliability, long-term data retention ability, and/or durability of different portions in each block based on the results of aforementioned tests, and then categorize the different portions of the block on a word-line basis based on the assessment result.

For example, in the embodiment where the blocks in the storage device 110 are realized with QLC chips, the manufacturer may divide the word lines in each block into four types: Q-type, T-type, M-type, and S-type. S-type means that a one-bit-per-cell program scheme (hereinafter referred to as the 1 bpc scheme) is the only suitable data program scheme that can be utilized for writing data into most of the storage cells coupled with the word line. M-type means that a two-bit-per-cell program scheme (hereinafter referred to as the 2 bpc scheme) is the suitable data program scheme that can be utilized for writing data into most of the storage cells coupled with the word line, and that the 1 bpc scheme is also suitable for writing data into most of the storage cells coupled with the word line. T-type means that a three-bit-per-cell program scheme (hereinafter referred to as the 3 bpc scheme) is the suitable data program scheme that can be utilized for writing data into most of the storage cells coupled with the word line, and that the 2 bpc scheme and the 1 bpc scheme are also suitable for writing data into most of the storage cells coupled with the word line. Q-type means a four-bit-per-cell program scheme (hereinafter referred to as the 4 bpc scheme) is the suitable data program scheme that can be utilized for writing data into most of the storage cells coupled with the word line, and that the 3 bpc scheme, the 2 bpc scheme and the 1 bpc scheme are also for writing data into most of the storage cells coupled with the word line.

The foregoing categorization indicates to some extent that the overall defects in the storage cells coupled with a M-type word line are less than the overall defects in the storage cells coupled with a S-type word line; the overall defects in the storage cells coupled with a T-type word line are less than the overall defects in the storage cells coupled with a M-type word line; and the overall defects in the storage cells coupled with a Q-type word line are less than the overall defects in the storage cells coupled with a T-type word line. In other words, the storage cells coupled with the Q-type word line have better circuit quality than those coupled with the word line of other types.

For another example, in the embodiment where the blocks in the storage device 110 are realized with TLC chips, the manufacturer may divide the word lines in each block into three aforementioned types: T-type, M-type, and S-type.

For yet another example, in the embodiment where the blocks in the storage device 110 are realized with MLC chips, the manufacturer may divide the word lines in each block into two aforementioned types: M-type and S-type.

It can be appreciated from the foregoing descriptions that the 1 bpc scheme is applicable to the storage cells coupled with the S-type word line, the M-type word line, the T-type word line, or the Q-type word line. The 2 bpc scheme is only applicable to the storage cells coupled with the M-type word line, the T-type word line, or the Q-type word line, but the 2 bpc scheme is not applicable to the storage cells coupled with the S-type word line. The 3 bpc scheme is only applicable to the storage cells coupled with the T-type word line and the Q-type word line, and not applicable to the storage cells coupled with the M-type word line or the S-type word line. The 4 bpc scheme is only applicable to the storage cells coupled with the Q-type word line, and not applicable to the storage cells coupled with the T-type word line, the M-type word line, or the S-type word line.

Please note that the foregoing adjectives, Q-type, T-type, M-type, and S-type are merely employed for the purpose of distinguishing different types of the word lines. In practice, other suitable names, codes, numbers, or indexes may be employed to represent different types of the word lines.

The manufacturer may store the categorization result of the word lines of each block of the storage device 110 in the electronic device 100 in advance. For example, in this embodiment, the categorization results of the word lines of each block in the storage device 110 may be stored in the aforementioned storage circuit 150 in an appropriate format in advance to be a word-line category record.

For example, FIG. 2 shows a simplified schematic diagram of a word-line category record 152 according to one embodiment of the present disclosure. The word-line category record 152 comprises the categorization result of the word lines in multiple blocks in the storage device 110. For example, data entries 210, 220, and 230 in the word-line category record 152 respectively represent the word-line types of the word lines 121, 122, and 123 in the block 112; data entries 240, 250, and 260 respectively represent the word-line types of the word lines 124, 125, and 126 in the block 114; and data entries 270, 280, and 290 respectively represent the word-line types of the word lines 127, 128, and 129 in the block 116.

According to the contents of the data entries 210-290 in the embodiment of FIG. 2, it can be founded that the word line 121 in the block 112 is categorized as a S-type word line; the word lines 122 and 123 in the block 112, and the word line 126 in the block 114 are categorized as M-type word lines; the word line 124 in the block 114 is categorized as a T-type word line; the word line 125 in the block 114 and the word lines 127, 128, and 129 in the block 116 are categorized as Q-type word lines.

It can be appreciated from the foregoing categorization approach of the word lines, the storage cells coupled with a Q-type word line possess the most flexibility in terms of selecting the data program scheme, a T-type word line possesses less flexibility than the Q-type word line, and a M-type word line possesses less flexibility than the T-type word line.

Accordingly, when data is required to be written into the storage device 110, the flash memory control circuit 164 may select an appropriate block from the storage device 110, and utilize corresponding program schemes selected based on the contents recorded in the word-line category record 152 to write the data into one or more pages coupled with respective word lines in the selected block.

In the following, it will be further described how the controller circuit 160 accesses the storage device 110. For illustrative convenience in the following description, it is assumed hereinafter that the block 114 is selected by the flash memory control circuit 164 as the block to be written with the data.

When the flash memory control circuit 164 needs to write a data D1 into physical locations corresponding to the word line 124 in the block 114 at a time point T1, the flash memory control circuit 164 may look up the category of the word line 124 in the word-line category record 152 shown in FIG. 2 and learn that the word line 124 is categorized as a T-type word line.

As described previously, T-type means that the storage cells coupled with the word line can be written with data by using the 3 bpc scheme, the 2 bpc scheme, or the 1 bpc scheme. The flash memory control circuit 164 may select a suitable program scheme based on the block management strategy applied at that time and control the access circuit 162 to write the data D1 into one or more pages coupled with the word line 124 using the selected program scheme.

For example, assuming that the block management strategy takes a capacity-take-priority approach at that time, then the access circuit 162 may utilize the 3 bpc scheme to write the data D1.

For another example, assuming that the block management strategy takes a performance-take-priority approach at that time, then the access circuit 162 may utilize the 1 bpc scheme to write the data D1.

For yet another example, assuming that the block management strategy takes a balance approach at that time, then the access circuit 162 may utilize the 3 bpc scheme or the 2 bpc scheme to write the data D1.

When the flash memory control circuit 164 needs to write another data D2 into physical locations corresponding to the word line 125 in the block 114 at another time point T2, the flash memory control circuit 164 may look up the category of the word line 125 in the word-line category record 152 shown in FIG. 2 and learn that the word line 125 is categorized as a Q-type word line.

As described previously, Q-type means that the storage cells coupled with the word line can be written with data by using the 4 bpc scheme, the 3 bpc scheme, the 2 bpc scheme, or the 1 bpc scheme. The flash memory control circuit 164 may select a suitable program scheme based on the block management strategy applied at that time and control the access circuit 162 to write the data D2 into one or more pages coupled with the word line 125 using the selected program scheme.

For example, assuming that the block management strategy takes the capacity-take-priority approach at that time, then the access circuit 162 may utilize the 4 bpc scheme to write the data D2.

For another example, assuming that the block management strategy takes the performance-take-priority approach at that time, then the access circuit 162 may utilize the 1 bpc scheme to write the data D2.

For yet another example, assuming that the block management strategy takes the balance approach at that time, then the access circuit 162 may utilize the 3 bpc scheme or the 2 bpc scheme to write the data D2.

When the flash memory control circuit 164 needs to write another data D3 into physical locations corresponding to the word line 126 in the block 114 at another time point T3, the flash memory control circuit 164 can look up the category of the word line 124 in the word-line category record 152 shown in FIG. 2 and learn that the word line 126 is categorized as a M-type word line.

As described previously, M-type means that the storage cells coupled with the word line can be written with data by using the 2 bpc scheme or the 1 bpc scheme. The flash memory control circuit 164 may select a suitable program scheme based on the block management strategy applied at that time and control the access circuit 162 to write the data D3 into one or more pages coupled with the word line 126 using the selected program scheme.

For example, assuming that the block management strategy takes the capacity-take-priority approach at that time, then the access circuit 162 may utilize the 2 bpc scheme to write the data D3.

For another example, assuming that the block management strategy takes the performance-take-priority approach at that time, then the access circuit 162 may utilize the 1 bpc scheme to write the data D3.

For yet another example, assuming that the block management strategy takes the balance approach at that time, then the access circuit 162 may utilize the 2 bpc scheme to write the data D3.

It can be appreciated from the foregoing descriptions that the controller circuit 160 may adopt different program schemes for different word lines in the same block 114 based on the circuit characteristics of the word lines. Therefore, it is possible that the data program schemes of the storage cells coupled with different word lines in the block 114 may be different at the same time point.

Figure 3:
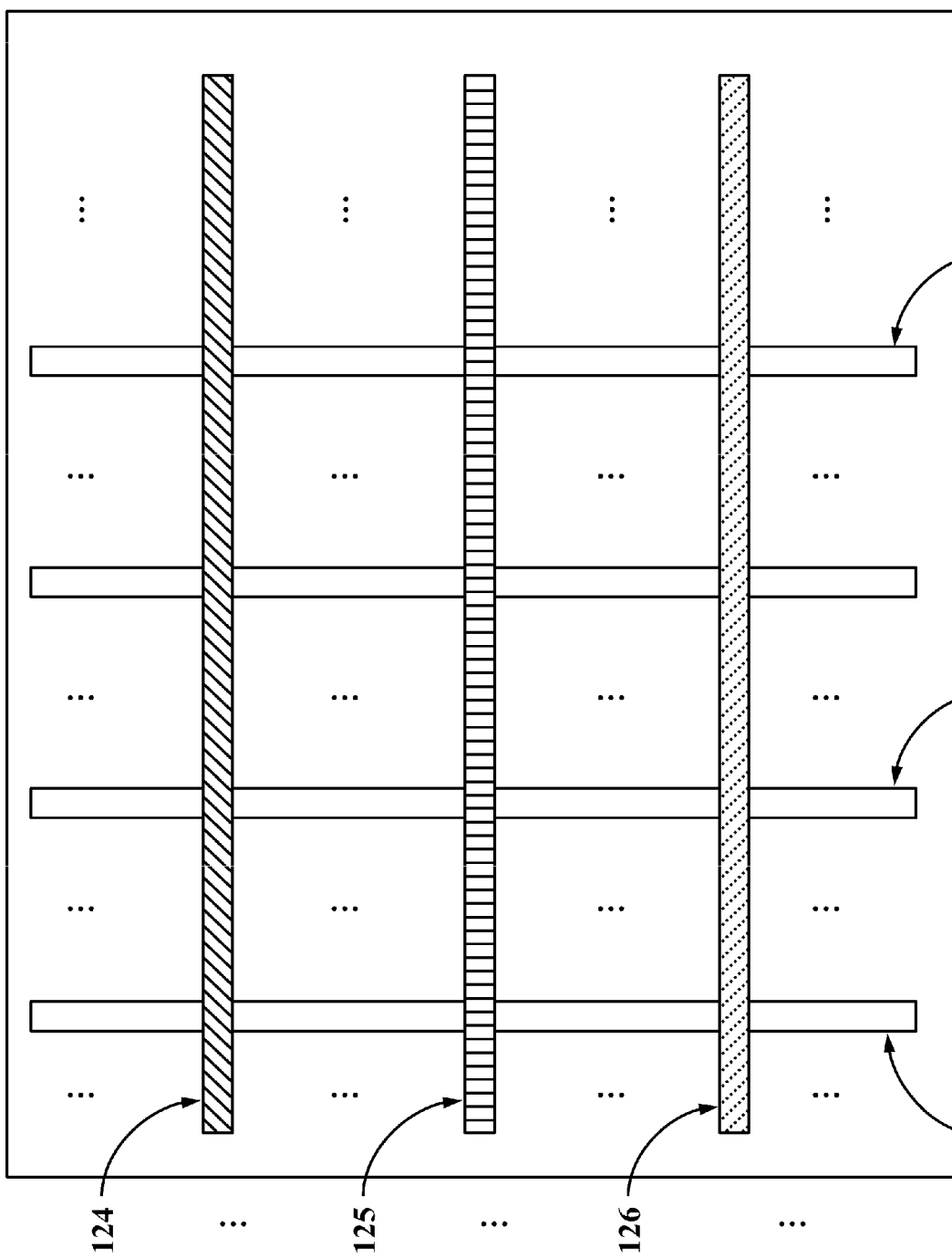
FIGS. 3-5 collectively show simplified schematic diagrams of the data writing scheme of a flash memory block of the electronic device in different situations.

For example, as shown in FIG. 3, when the flash memory control circuit 164 takes the capacity-take-priority approach to manage the storage device 110, the access circuit 162 may utilize the 3 bpc scheme to write the data D1 into one or more pages coupled with the word line 124 at the time point T1, utilize the 4 bpc scheme to write the data D2 into one or more pages coupled with the word line 125 at the time point T2, and utilize the 2 bpc scheme to write the data D3 into one or more pages coupled with the word line 126 at the time point T3. As a result, the data D1 written by using the 3 bpc scheme, the data D2 written by using the 4 bpc scheme, and the data D3 written by using the 2 bpc scheme will present in the block 114 at the same time.

For other blocks in the storage device 110, the controller circuit 160 may select suitable program schemes for the storage cells coupled with respective word lines based on the content of the word-line category record 152.

As time passed, the flash memory control circuit 164 may erase the data stored in the block 114, so that the block 114 can be used to store other data.

In addition, during the operation of the storage device 110, the flash memory control circuit 164 may dynamically change the block management strategy based on the remaining storage space in the storage device 110, the data properties of the data to be written into the storage device 110, the request from the host device, the user's configuration, or the current operation environment of the electronic device 100.

Figure 4:
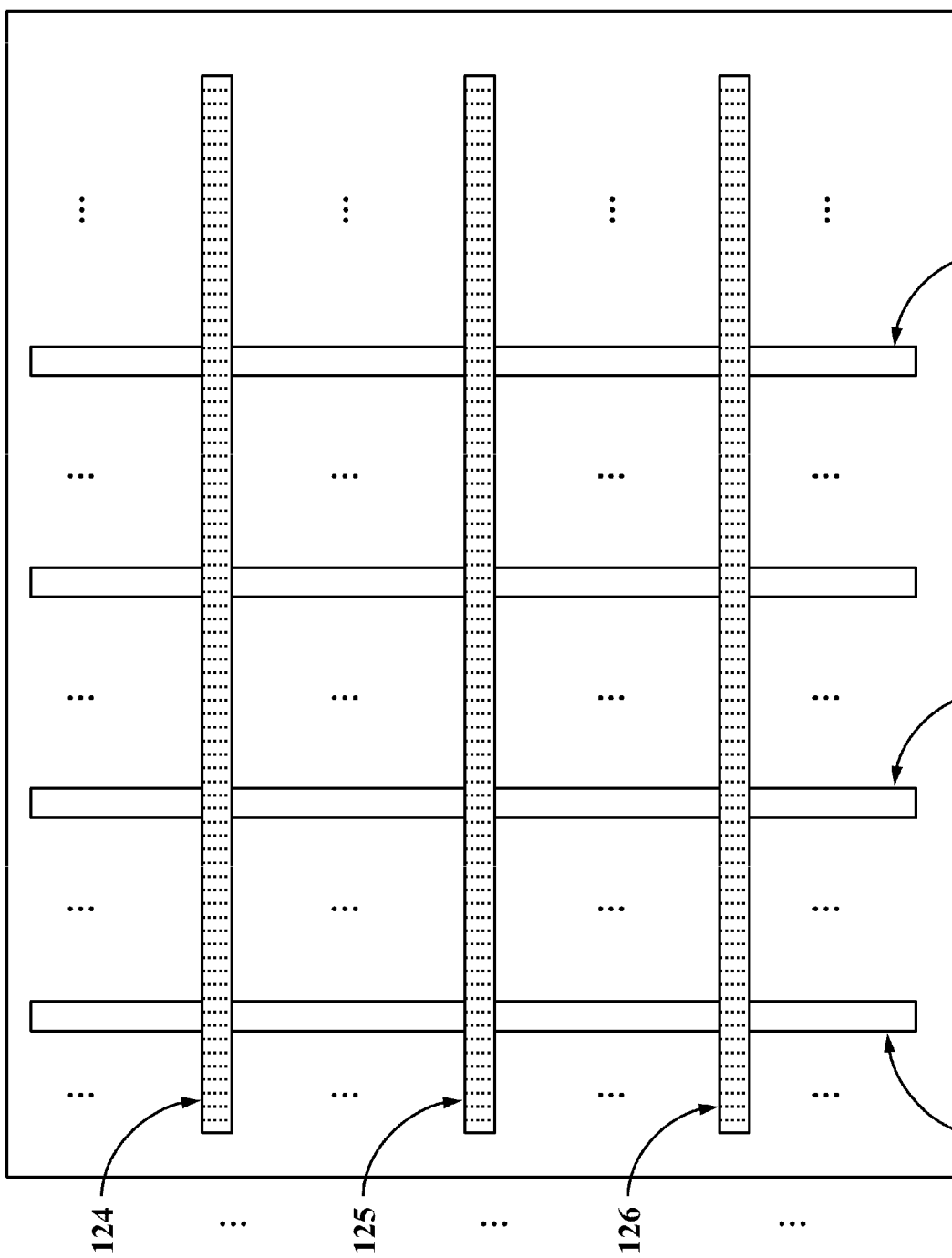

For example, a data that will be accessed frequently is called a hot data, and a data that is rarely accessed is called a cold data. After the block 114 is erased, if the flash memory control circuit 164 needs to respectively write new data D4, D5, and D6 that are hot data into the locations corresponding to the word lines 124, 125, and 126 in the block 114, the flash memory control circuit 164 may take the performance-take-priority approach to access the block 114. In this situation, as shown in FIG. 4, the flash memory control circuit 164 may control the access circuit 162 to utilize the 1 bpc scheme to write the data D4 into one or more pages coupled with the word line 124 at a time point T4, to utilize the 1 bpc scheme to write the data D5 into one or more pages coupled with the word line 125 at a time point T5, and to utilize the 1 bpc scheme to write the data D6 into one or more pages coupled with the word line 126 at a time point T6. As a result, the data D4, D5, and D6 stored in the block 114 would have the same data program scheme, i.e., the 1 bpc scheme.

Figure 5:
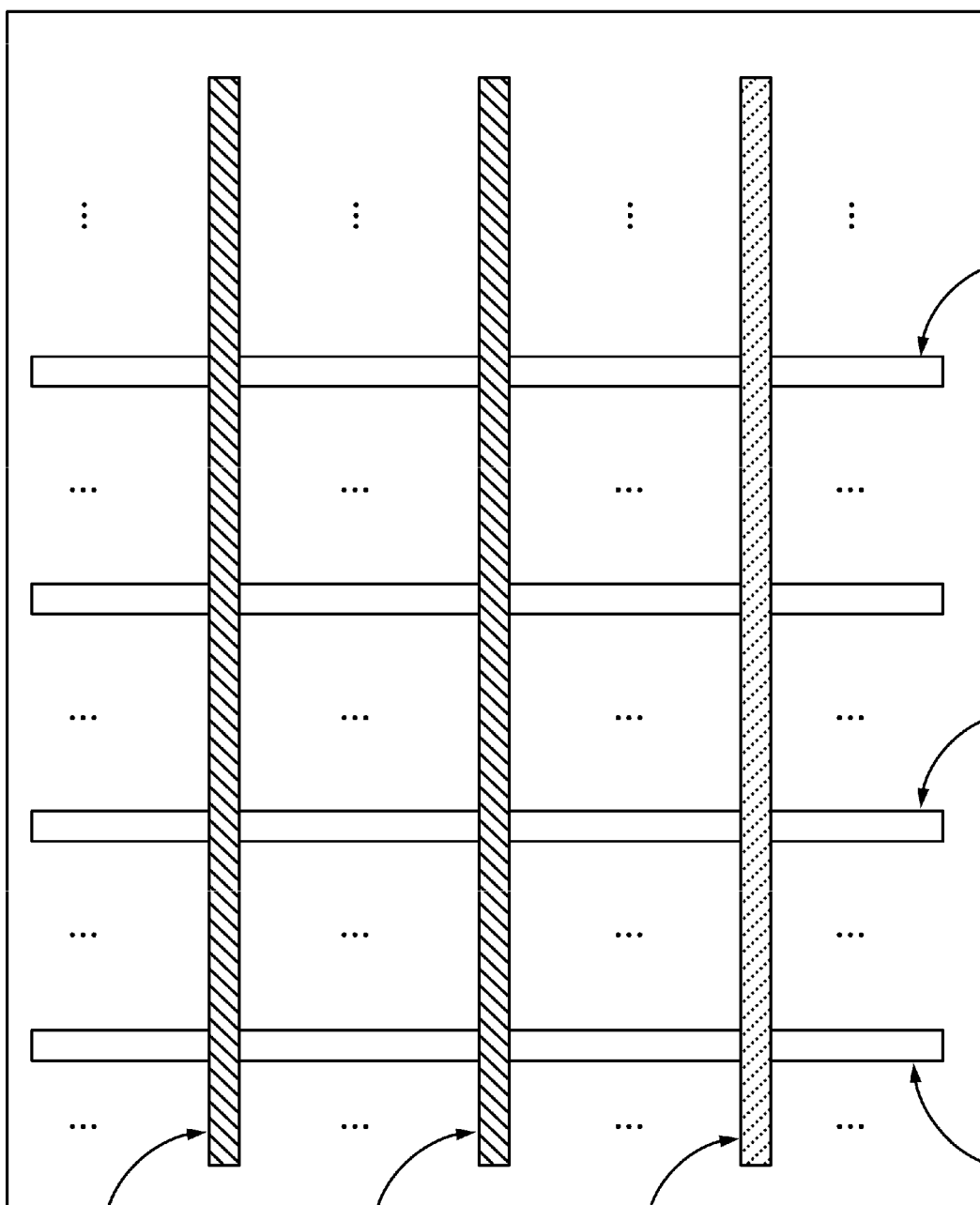

For another example, after the block 114 is erased, if the host device or the user requests the flash memory control circuit 164 to adjust the management strategy to the balance approach, and the flash memory control circuit 164 needs to respectively write new data D7, D8, and D9 into the locations corresponding to the word lines 124, 125, and 126 in the block 114, the flash memory control circuit 164 may take the balance approach to access the block 114. In this situation, as shown in FIG. 5, the flash memory control circuit 164 may control the access circuit 162 to utilize the 3 bpc scheme to write the data D7 into one or more pages coupled with the word line 124 at a time point T7, to utilize the 3 bpc scheme to write the data D8 into one or more pages coupled with the word line 125 at a time point T8, and to utilize the 2 bpc scheme to write the data D9 into one or more pages coupled with the word line 126 at a time point T9. As a result, the data D7 and the data D8 written by utilizing the 3 bpc scheme and the data D9 written by utilizing the 2 bpc scheme will present in the block 114 at the same time.

As can be appreciated from the foregoing descriptions, for the pages coupled with the same word line in the block 114, the controller circuit 160 may adopt different data program schemes to write data at different time points. For example, in the foregoing embodiment, sometimes the program scheme corresponding to the word line 124 in the block 114 is the 3 bpc scheme, and sometimes the 1 bpc scheme; sometimes the program scheme corresponding to the word line 125 is the 4 bpc scheme, sometimes the 1 bpc scheme, and sometimes the 3 bpc scheme; and sometimes the program scheme corresponding to the word line 126 is the 2 bpc scheme, and sometimes the 1 bpc scheme.

As can be appreciated from the foregoing descriptions, the flash memory control circuit 164 configures the data program scheme for related pages on a word-line basis, and thus the flexibility in selecting the data program scheme to write data into the flash memory block can be significantly increased.

The foregoing block management approach has beneficial effect on fully utilizing the storage capacity of each flash memory block, and thus it can equivalently increase the storage space of the electronic device 100 without increasing the quantity of the flash memory blocks arranged in the storage device 110.

On the other hand, since the flash memory control circuit 164 may adaptably utilize different data program schemes to write data into the physical locations of different types of word lines, the reliability data stored in each block can be improved.

As the number of write operations or erase operations increases, the circuit defects existing in the storage cells coupled with respective word lines might increase or the data reliability might decrease. Therefore, during the operation of the storage device 110, the flash memory control circuit 164 may dynamically update the content of corresponding data entry in the foregoing word-line category record 152 based on the number of write operations or erase operations of the pages of respective word lines. The flash memory control circuit 164 may also conduct various suitable reliability tests on the pages coupled with each word line, and dynamically adjust the content of corresponding data entry in the foregoing word-line category record 152 based on the test results.

For example, as shown in FIG. 6, when the flash memory control circuit 164 determines that the 1 bpc scheme becomes the only suitable scheme for use in writing data into the storage cells coupled with the word line 123, the flash memory control circuit 164 may change the data entry from the previous one—data entry 230—to the new one—data entry 630—in the word-line category record 152 to change the type of the word line 123 from M-type to S-type.

For yet another example, when the flash memory control circuit 164 determines that the 3 bpc scheme, the 2 bpc scheme, and the 1 bpc scheme are the only schemes suitable for use in writing data into the storage cells coupled with the word line 125, and the 4 bpc scheme is no longer suitable for use in writing data into the storage cells coupled with the word line 125, the flash memory control circuit 164 may change the data entry from the previous one—data entry 250—to the new one—data entry 650—in the word-line category record 152 to change the type of the word line 125 from Q-type to T-type.

As is well known in related art, the conventional flash memory control circuit utilizes the same data program scheme for all pages in the same block, without considering the fact that different portions of the same block might have different circuit characteristics. Accordingly, when the conventional flash memory control circuit utilizes a higher-class data program scheme to write data into a selected block, yet the block is unable to support the higher-level data program scheme due to having defects in some physical locations, it may easily result in data error problems or increase the possibility for the block be determined as a bad block by the conventional flash memory control circuit. Once the possibility increases for a block to be determined as a bad block, the overall storage space available in the conventional storage device will decrease.

Different from the bad block management mechanism adopted by the conventional art, as long as the quantity of pages coupled with the word lines in a block of the storage device 110 remains sufficient to support a lower-class data program scheme, the flash memory control circuit 164 of this embodiment will manage the block in the foregoing manner, instead of marking the block as a bad block. The flash memory control circuit 164 will mark a block as a bad block only when all the pages (or more than a predetermined quantity of the pages) coupled with the word lines in the block are no longer suitable for storing data. As a result, it lowers the possibility of that a block is determined as a bad block by the flash memory control circuit 164, thereby increasing the available storage space in the storage device 110 and extending the durability of the storage device 110.

In some embodiments, the foregoing flash memory control circuit 164 may flexibly adjust the function or role of respective blocks in the storage device 110. In practical application, some blocks in the storage device 110 may be employed as the OP (over provision) blocks, and the other blocks may be employed as the data blocks. As described previously, the quantity of the OP blocks affects the operating performance of the electronic device 100, and the quantity of the data blocks affects the storage capacity of the electronic device 100.

Therefore, during the operation of the storage device 110, the flash memory control circuit 164 may flexibly adjust the function or role of some blocks in the storage device 110 based on a predetermined management strategy, a remaining storage space in the storage device 110, a request from the host device, the user's configuration, or the current operation environment of the electronic device 100.

For example, the flash memory control circuit 164 may configure the block 114 as a data block when the storage device 110 needs to provide more data storage space at a first time period P1, and the flash memory control circuit 164 may configure the block 114 as an OP block when the storage device 110 needs to improve the access efficiency at a second time period P2. In other words, some blocks in the storage device 110 (e.g., the aforementioned block 114) may play different roles at different time periods.

As a result, the flexibility in adjusting the function or role of the blocks in the storage device 110 can be significantly improved, thereby effectively improving the operation flexibility and application flexibility of the electronic device 100.

Please note that the foregoing circuit structure shown in FIG. 1 is merely an exemplary embodiment, rather than a restriction to the practical implementations.

Figure 7:
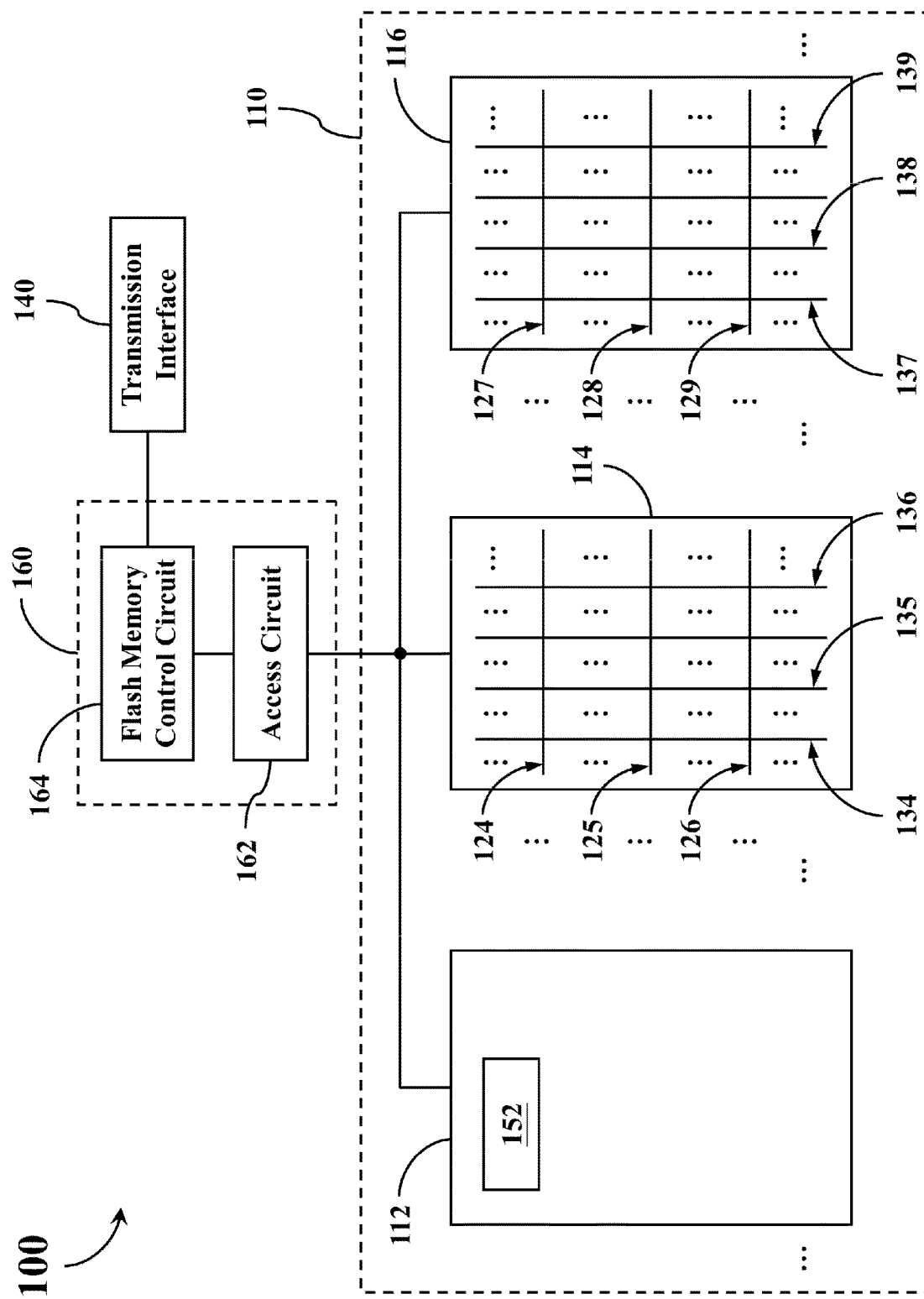
FIG. 7 shows a simplified functional block diagram of an electronic device according to a second embodiment of the present disclosure.

For example, FIG. 7 shows a simplified functional block diagram of an electronic device according to a second embodiment of the present disclosure. In the embodiment shown in FIG. 7, the foregoing word-line category record 152 is stored in a selected block in the storage device 110, such as the block 112.

In some other embodiments, the foregoing word-line category record 152 may be divided into several segments and separately stored in different blocks of the storage device 110.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple", phrases "be coupled with," "couples with," and "coupling with" are is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

The foregoing is only one better embodiment of the present disclosure. The equivalent change or modification of the claims of the present disclosure fall within the scope of the present disclosure.

What is claimed is:

1. An electronic device (100), comprising:
   a storage device (110), comprising a plurality of flash memory blocks (112, 114, 116), wherein the flash memory blocks (112, 114, 116) comprises a target block (114), and the target block (114) comprises a plurality of word lines (112, 114, 116) and a plurality of bit lines (134, 135, 136);
   a transmission interface (140) arranged to operably receive data to be written into the storage device (110);
   a controller circuit (160), comprising:
   an access circuit (162) coupled with the storage device (110); and
   a flash memory control circuit (164) coupled with the access circuit (162) and the transmission interface (140), and arranged to operably conduct following operations:
   controlling the access circuit (162) to write a first data (D1) into one or more pages coupled with a first word line (124) in the target block (114) using a first program scheme at a first time point (T1); and
   controlling the access circuit (162) to write a second data (D2) into one or more pages coupled with a second word line (125) in the target block (114) using a second program scheme at a second time point (T2), so as to render both the first data (D1) and the second data (D2) to be present in the target block (114) at the same time, and
   a non-volatile storage circuit (150) coupled with the flash memory control circuit (164), storing a word line category record that associates each word line of each memory block with a particular word line category, and each word line category is associated with a data program scheme;
   wherein the first program scheme and the second program schemes are different schemes, and wherein the access circuit controls the writing of data into a particularly memory block via the word line that word line category record has associated with data program scheme associated with that data.

2. The electronic device (100) of claim 1, wherein the flash memory control circuit (164) is further arranged to operably determine the first program scheme according to a word-line type corresponding to the first word line (124), and to operably determine a second program scheme according to a word-line type corresponding to the second word line (125), and wherein the first program scheme and the second program scheme are both selected from the group consisting of a 1 bit-per-cell (bpc) program scheme, a 2 bpc program scheme, a 3 bpc program scheme, and a program scheme having more than 3 bits-per-cell.

3. The electronic device (100) of claim 2, wherein the first word line (124) is categorized as a first word-line type and the second word line (125) is categorized as a second word-line type different from the first word-line type;

wherein the first program scheme is one of multiple program schemes corresponding to the first word-line type, and is also one of multiple program schemes corresponding to the second word-line type, while the second program scheme is one of the multiple program schemes corresponding to the second word-line type but is not one of the multiple program schemes corresponding to the first word-line type.

4. The electronic device (100) of claim 1, wherein the word-line category record (152) is recorded with word-line types of respective word lines of the multiple word lines (124, 125, 126).

5. The electronic device (100) of claim 2, wherein the storage device (110) is stored with a word-line category record (152), wherein the word-line category record (152) is recorded with word-line types of respective word lines of the multiple word lines (124, 125, 126).

6. The electronic device (100) of claim 2, wherein the flash memory control circuit (164) is further arranged to operably conduct following operation:

controlling the access circuit (162) to write a third data (D5) into one or more pages coupled with the second word line (125) in the target block (114) using a program scheme different from the second program scheme at a third time point (T5).

7. The electronic device (100) of claim 2, wherein the flash memory control circuit (164) is further arranged to operably configure the target block (114) as a data block at a first time period (P1), and to operably configure the target block (114) as an over provision block at a second time period (P2) different from the first time period (P1).

8. A controller circuit (160) for controlling a storage device (110), wherein the storage device (110) comprises a plurality of flash memory blocks (112, 114, 116), the flash memory blocks (112, 114, 116) comprise a target block (114), the target block (114) comprises a plurality of word lines (124, 125, 126) and a plurality of bit lines (134, 135, 136), the controller circuit (160) comprising:

an access circuit (162) for coupling with the storage device (110); and a flash memory control circuit (164) coupled with the access circuit (162) and for coupling with a transmission interface (140), wherein the transmission interface (140) is arranged to operably receive data to be written into the storage device (110);

wherein the flash memory control circuit (164) is coupled with a storage circuit (150), and the storage circuit (150) stores a word line category record that associates each word line of each memory block with a particular word line category, and each word line category is associated with a data program scheme;

wherein the flash memory control circuit (164) is arranged to operably conduct following operations:

controlling the access circuit (162) to write a first data (D1) into one or more pages coupled with a first word line (124) in the target block (114) using a first program scheme at a first time point (T1); and controlling the access circuit (162) to write a second data (D2) into one or more pages coupled with a second word line (125) in the target block (114) using a second program scheme at a second time point (T2), so as to render both the first data (D1) and the second data (D2) to be present in the target block (114) at the same time, wherein the first program scheme and the second program schemes are different schemes, and wherein the access circuit controls the writing of data into a particularly memory block via the word line that word line category record has associated with data program scheme associated with that data.

9. The controller circuit (160) of claim 8, wherein the flash memory control circuit (164) is further arranged to operably determine the first program scheme according to a word-line type corresponding to the first word line (124), and to operably determine the second program scheme according to a word-line type corresponding to the second word line (125), and wherein the first program scheme and the second program scheme are both selected from the group consisting of a 1 bit-per-cell (bpc) program scheme, a 2 bpc program scheme, a 3 bpc program scheme, and a program scheme having more than 3 bits-per-cell.

10. The controller circuit (160) of claim 9, wherein the first word line (124) is categorized as a first word-line type and the second word line (125) is categorized as a second word-line type different from the first word-line type;

wherein the first program scheme is one of multiple program schemes corresponding to the first word-line type, and is also one of multiple program schemes corresponding to the second word-line type, while the second program scheme is one of the multiple program schemes corresponding to the second word-line type but is not one of the multiple program schemes corresponding to the first word-line type.

11. The controller circuit (160) of claim 8, wherein the word-line category record (152) is recorded with word-line types of respective word lines of the word lines (124, 125, 126).

12. The controller circuit (160) of claim 9, wherein the storage device (110) is stored with a word-line category record (152), and the word-line category record (152) is recorded with word-line types of respective word lines of the word lines (124, 125, 126).

13. The controller circuit (160) of claim 9, wherein the flash memory control circuit (164) is further arranged to operably conduct following operation:

controlling the access circuit (162) to write a third data (D5) into one or more pages coupled with the second word line (125) in the target block (114) using a program scheme different from the second program scheme at a third time point (T5).

14. The controller circuit (160) of claim 9, wherein the flash memory control circuit (164) is further arranged to operably configure the target block (114) as a data block at a first time period (P1), and to operably configure the target block (114) as an over provision block at a second time period (P2) different from the first time period (P1).

15. A method for controlling a storage device (110), wherein the storage device (110) comprises a plurality of flash memory blocks (112, 114, 116), the flash memory blocks (112, 114, 116) comprise a target block (114), the target block (114) comprises a plurality of word lines (124, 125, 126) and a plurality of bit lines (134, 135, 136), the method comprising:

writing a first data (D1) into one or more pages coupled with a first word line (124) in the target block (114) using a first program scheme at a first time point (T1);

writing a second data (D2) into one or more pages coupled with a second word line (125) in the target block (114) using a second program scheme at a second time point (T2), so as to render both the first data (D1) and the second data (D2) to be present in the target block (114) at the same time; and maintaining a word line category record that associates each word line of each memory block with a particular word line category, and each word line category is associated with a data program scheme, wherein the first program scheme and the second program schemes are different schemes, and wherein the access circuit controls the writing of data into a particularly memory block via the word line that word line category record has associated with data program scheme associated with that data.

16. The method of claim 15, further comprising:

determining the first program scheme according to a word-line type corresponding to the first word line (124); and determining the second program scheme according to a word-line type corresponding to the second word line (125).

17. The method of claim 16, wherein the first word line (124) is categorized as a first word-line type and the second word line (125) is categorized as a second word-line type different from the first word-line type;

wherein the first program scheme is one of multiple program schemes corresponding to the first word-line type, and is also one of multiple program schemes corresponding to the second word-line type, while the second program scheme is one of the multiple program schemes corresponding to the second word-line type but is not one of the multiple program schemes corresponding to the first word-line type, and wherein the first program scheme and the second program scheme are both selected from the group consisting of a 1 bit-per-cell (bpc) program scheme, a 2 bpc program scheme, a 3 bpc program scheme, and a program scheme having more than 3 bits-per-cell.

18. The method of claim 15, further comprising:

providing a non-volatile storage circuit (150) arranged to operably store the word-line category record (152), wherein the word-line category record (152) is recorded with word-line types of respective word lines of the word lines (124, 125, 126).

19. The method of claim 16, wherein the storage device (110) is stored with a word-line category record (152), and the word-line category record (152) is recorded with word-line types of respective word lines of the word lines (124, 125, 126).

20. The method of claim 16, further comprising:

writing a third data (D5) into one or more pages coupled with the second word line (125) in the target block (114) using a program scheme different from the second program scheme at a third time point (T5).

* * * * *